United States Patent
Liang

(10) Patent No.: US 8,912,029 B2
(45) Date of Patent: Dec. 16, 2014

(54) MANUFACTURING PROCESS OF VERTICAL TYPE SOLID STATE LIGHT EMITTING DEVICE

(71) Applicant: Lextar Electronics Corporation, Hsinchu (TW)

(72) Inventor: Wen-Teng Liang, Hsinchu County (TW)

(73) Assignee: Lextar Electronics Corporation, Hsinchu (TW)

( * ) Notice: Subject to any disclaimer, the term of this patent is extended or adjusted under 35 U.S.C. 154(b) by 99 days.

(21) Appl. No.: 13/845,191

(22) Filed: Mar. 18, 2013

(65) Prior Publication Data
US 2013/0337598 A1    Dec. 19, 2013

(30) Foreign Application Priority Data
Jun. 19, 2012   (TW) ............................ 101121955 A

(51) Int. Cl.
  H01L 21/00   (2006.01)
  H01L 21/30   (2006.01)
  H01L 21/46   (2006.01)
  H01L 21/02   (2006.01)
  H01L 33/32   (2010.01)
  H01L 33/00   (2010.01)

(52) U.S. Cl.
  CPC .......... *H01L 33/32* (2013.01); *H01L 21/02513* (2013.01); *H01L 21/02505* (2013.01); *H01L 21/02458* (2013.01); H01L 33/007 (2013.01); *H01L 21/02664* (2013.01); *H01L 21/02491* (2013.01); *H01L 21/0254* (2013.01); *H01L 33/0079* (2013.01)
  USPC ............................................ 438/46; 438/458

(58) Field of Classification Search
  None
  See application file for complete search history.

(56) References Cited

U.S. PATENT DOCUMENTS

| | | | |
|---|---|---|---|
| 6,703,255 B2* | 3/2004 | Shibata et al. | 438/46 |
| 2002/0056840 A1* | 5/2002 | Tsai et al. | 257/78 |
| 2006/0091409 A1* | 5/2006 | Epler et al. | 257/95 |
| 2012/0305974 A1* | 12/2012 | Cheong | 257/98 |

FOREIGN PATENT DOCUMENTS

TW    200731554    8/2007

OTHER PUBLICATIONS

English Abstract translation of TW200731554 (Published Aug. 16, 2007).

* cited by examiner

*Primary Examiner* — Andres Munoz
(74) *Attorney, Agent, or Firm* — McClure, Qualey & Rodack, LLP

(57) ABSTRACT

A manufacturing process of a vertical type solid state light emitting device is provided. A substrate is provided. M metal nitride buffer layer is formed on the substrate, and a breakable structure containing M metal droplet structures is formed on the buffer layer. A first type semiconductor layer, an active layer and a second type semiconductor layer are sequentially formed on the breakable structure. A second type electrode is formed on the second type semiconductor layer. The first type semiconductor layer, the active layer, the second type semiconductor layer and the second type electrode are stacked to form a light emitting stacking structure. The breakable structure is damaged to separate from the light emitting stacking structure, so that a surface of the first type semiconductor layer of the light emitting stacking structure is exposed. A first type electrode is formed on the surface of the first type semiconductor layer.

14 Claims, 4 Drawing Sheets

MANUFACTURING PROCESS OF VERTICAL TYPE SOLID STATE LIGHT EMITTING DEVICE

This application claims the benefit of Taiwan application Serial No. 101121955, filed Jun. 19, 2012, the subject matter of which is incorporated herein by reference.

BACKGROUND OF THE INVENTION

1. Field of the Invention

The invention relates in general to a manufacturing process of a semiconductor device, and more particularly to a manufacturing process of a vertical type solid state light emitting device.

2. Description of the Related Art

Light emitting diode (LED) emits a light by converting electric energy into photo energy. Conventional vertical type LED includes an epitaxy growth layer and an upper electrode layer and a lower electrode layer respectively disposed on a top surface and a bottom surface of the epitaxy growth layer. When electricity is provided to the upper and the lower electrode layer of the LED, the current flows through the epitaxy stacking structure, which releases energy in the form of a light when electrons and electron holes are combined.

In the manufacturing process of the vertical type light emitting diode, a light emitting stacking structure is formed on a sapphire substrate whose lattice constant is close to that of the epitaxy growth layer, wherein the epitaxy can easily grow on the sapphire substrate. Next, a conductive substrate is disposed on a top surface of the light emitting stacking structure. Then, the sapphire substrate is removed from a bottom side of the light emitting stacking structure by mechanical grinding process or laser lift-off process. Then, a lower electrode layer is formed on the bottom side of the light emitting stacking structure to complete a conventional vertical type light emitting diode.

However, there are problems arising from the conventional mechanical grinding technology used for processing the sapphire substrate. That is, the grinding thickness is hard to control at precision and the process is time consuming. Although the laser lift-off technology can quickly lift off the sapphire substrate, the laser lift-off equipment is expensive. Moreover, the adjustment of laser power is crucial to the yield of the manufacturing process. If the laser power is too high, the epitaxy growth layer will be damaged; conversely, if the laser power is too low, the sapphire substrate cannot be removed smoothly. In short, the technology of adjusting laser power is complicated, and is not a reliable technology in the manufacturing process.

SUMMARY OF THE INVENTION

The invention is directed to a manufacturing process of a vertical type solid state light emitting device capable of easily lifting off the substrate without damaging the light emitting stacking structure, hence increasing the yield and timeliness of the manufacturing process.

According to one embodiment of the present invention, a manufacturing process of a vertical type solid state light emitting device is provided. The manufacturing process includes the following steps. A substrate is provided. An M metal nitride buffer layer is formed on the substrate, and then a breakable structure is formed on the buffer layer, wherein the breakable structure contains a plurality of M metal droplet structures. A first type semiconductor layer, an active layer and a second type semiconductor layer are formed on the breakable structure in sequence. A second type electrode is formed on the second type semiconductor layer, and the first type semiconductor layer, the active layer, the second type semiconductor layer and the second type electrode are stacked to form a light emitting stacking structure. The breakable structure is damaged to separate from the light emitting stacking structure, so that a surface of the first type semiconductor layer of the light emitting stacking structure is exposed. A first type electrode is formed on the surface of the first type semiconductor layer.

The above and other aspects of the invention will become better understood with regard to the following detailed description of the preferred but non-limiting embodiments. The following description is made with reference to the accompanying drawings.

DETAILED DESCRIPTION OF THE INVENTION

The manufacturing process of a vertical type solid state light emitting device of the present embodiment includes the following steps. A buffer layer is formed on the substrate. Next, a breakable structure is formed on the buffer layer. Next, a light emitting stacking structure is formed on the breakable structure. The breakable structure is formed by a nitride reactant deposited in solid state and liquid metal precipitates attached on a surface of the nitride reactant. The metal precipitates are droplet structures having low melting point and being scattered and attached on the nitride reactant, and are not aggregated as a stable solid structure. Therefore, the molecular forces of the breakable structure may be easily damaged by an external force or thermal stress, and the substrate may be easily lifted off the bottom of the light emitting stacking structure without damaging the light emitting stacking structure, hence increasing the yield and timeliness of the manufacturing process. Besides, the manufacturing process of a vertical type solid state light emitting device using the breakable structure only requires ordinary equipment capable of heating the metal droplet structures to the melting point without employing high cost grinding equipment or laser lift-off equipment, hence reducing the cost of the manufacturing equipment.

A number of embodiments are disclosed below for elaborating the invention. However, the embodiments of the invention are for detailed descriptions only, not for limiting the scope of protection of the invention.

First Embodiment

Figure 1A:
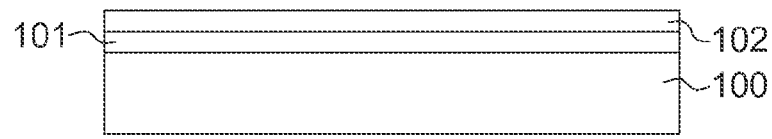
FIGS. 1A~1I respectively illustrate details of a manufacturing process of a vertical type solid state light emitting device according to an embodiment of the invention.
Figure 1B:
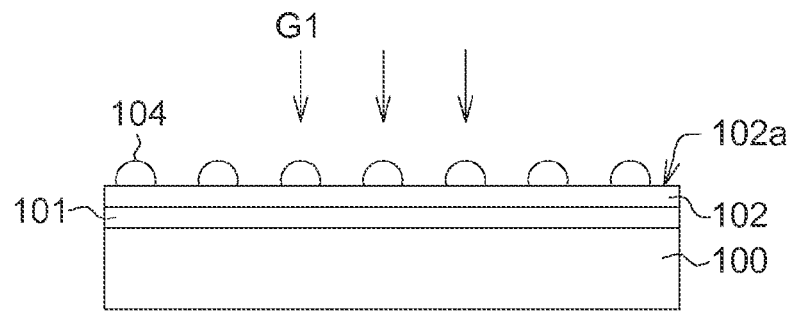
Figure 1C:
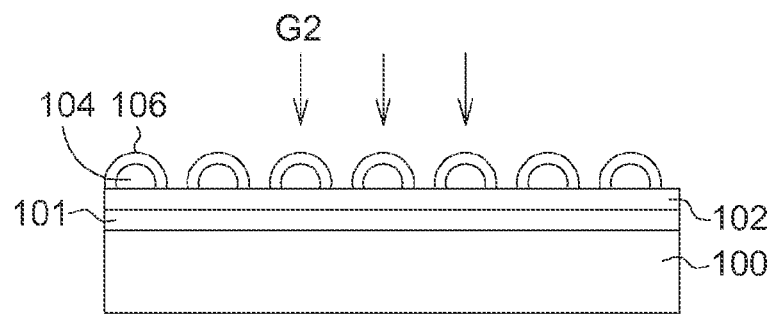
Figure 1D:
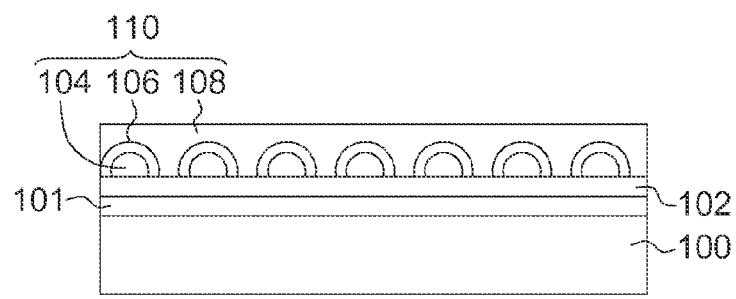
Figure 1E:
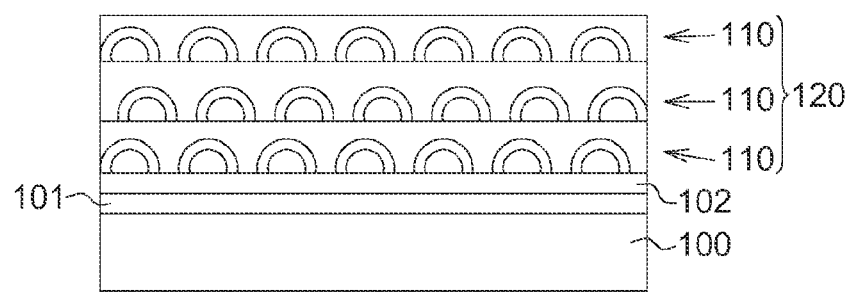
Figure 1F:
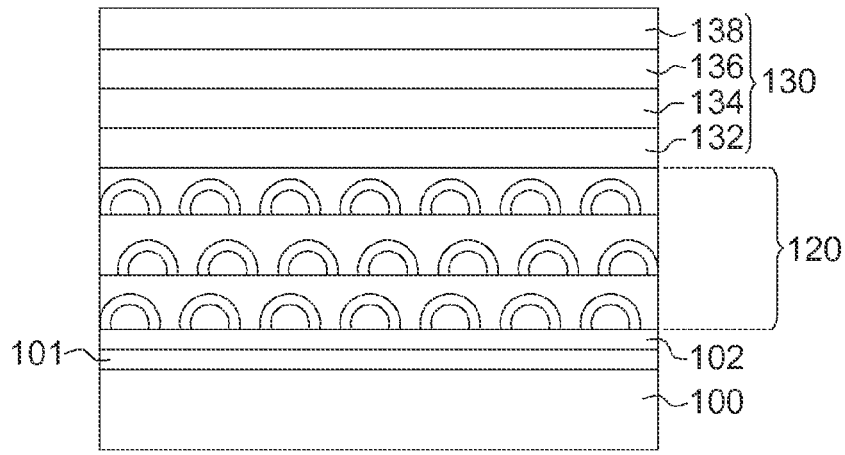
Figure 1G:
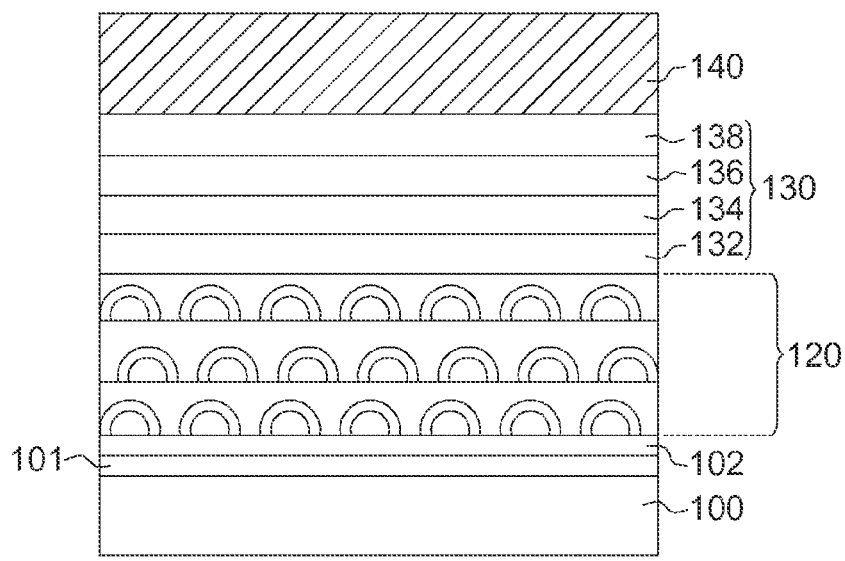
Figure 1H:
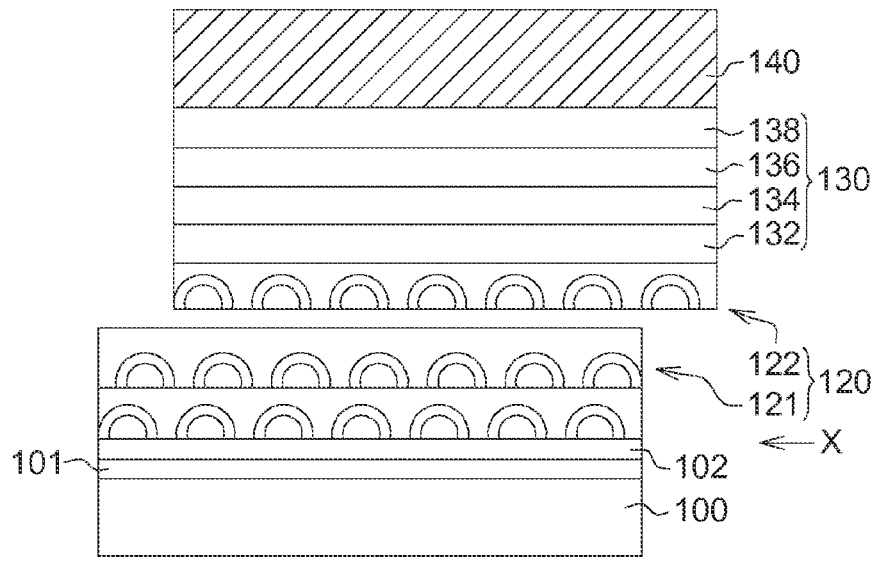
Figure 1I:
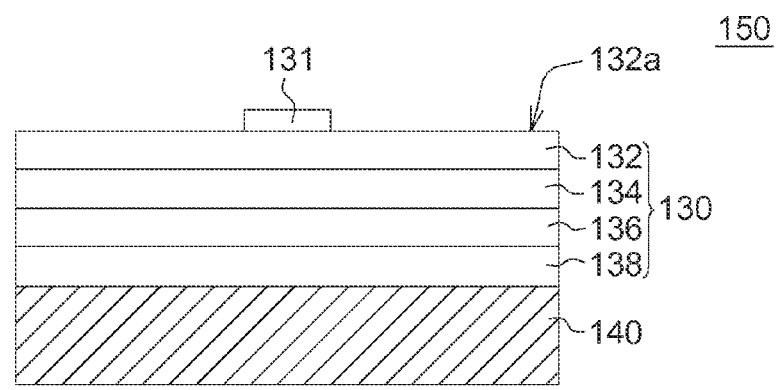

FIGS. 1A~1I respectively illustrate details of a manufacturing process of a vertical type solid state light emitting device according to an embodiment of the invention. FIGS. 1A~1E respectively illustrate detailed procedures of forming a breakable structure 120 on a substrate 100 according to an embodiment of the invention. FIGS. 1F~1G respectively illustrate detailed procedures of forming a light emitting stacking structure 130 and a supporting substrate 140 on a breakable structure 120 according to an embodiment of the invention. FIGS. 1H~1I respectively illustrate detailed procedures of removing a substrate 100 and forming a first type electrode 131 according to an embodiment of the invention.

Detailed procedures of forming the breakable structure 120 are disclosed below, but are not for limiting the scope of the invention. Referring to FIG. 1A, firstly, a substrate 100 is provided. Next, an M metal nitride buffer layer 101 may be grown on the substrate 100 by chemical vapor deposition method. Then, a first M metal nitride layer 102 is grown on the buffer layer 101 in a high temperature environment. The commonly used chemical vapor deposition method is such as organic metal chemical vapor deposition method, in which the reaction precursor may be an organic metal compound, and the M metal nitride buffer layer 101 and the first M metal nitride layer 102 may be formed by nitrogenization under an ammonia environment. Referring to FIG. 1B, a first reaction gas G1 is infused to react with the first M metal nitride layer 102, so that a portion of M metal is precipitated from the first M metal nitride layer 102, and then a plurality of M metal droplet structures 104 are formed on the surface 102a of the first M metal nitride layer 102, wherein M denotes a metallic element of the periodic table.

For example, the first M metal nitride layer 102 is made of Group III nitride, such as boron (B), aluminum (Al), gallium (Ga), indium (In), or thallium (Tl) nitride of group III of the periodic table. The melting point of gallium is 29.8° C. and the boiling point is 2403° C. In an embodiment, a gallium nitride layer is formed on the substrate 100 and then a first reaction gas G1 (such as hydrogen) is infused to react with the gallium nitride layer, so that some of gallium metals are precipitated from the gallium nitride layer to form a plurality of gallium droplet structures on the surface of the gallium nitride layer.

In an embodiment, the first reaction gas G1 (such as hydrogen) reacts with the gallium nitride layer at 800~1500° C. to precipitate a plurality of gallium droplet structures. The chemical equation is expressed as:

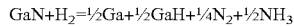

Referring to FIG. 1C, a second reaction gas G2 (such as ammonia) is infused to react with the M metal droplet structures 104, and an M metal nitride 106 is formed on respective surface of the M metal droplet structures 104. That is, in a high temperature environment, the gallium obtained by precipitation according to the above chemical equation reacts with the second reaction gas G2, a gallium nitride is grown outside the gallium, but the interior of the gallum is still unchanged.

Referring to FIG. 1D, a second M metal nitride layer 108 is formed on the first M metal nitride layer 102 by a chemical vapor deposition method for example, so that the second M metal nitride layer 108 covers the M metal droplet structures 104 to form a breakable layer 110, wherein the surface of the M metal droplet structures 104 has the M metal nitride 106 formed thereon. Since the inner of the breakable layer 110 contains gallium whose low melting point is low, the gallium in the inner will be in liquid state as long as the breakable layer 110 is heated to be over 29.8° C., but the gallium nitride on the outside surface is still in solid state.

Referring to FIG. 1E, the steps of FIGS. 1B~1D are repeated for such as two times, but no limit thereto, to form a plurality of breakable layers 110 on the substrate 100, so that the breakable layers 110 together form a breakable structure 120. Since the gallium of the breakable structure 120 of the present embodiment is in liquid state and the molecular force of the breakable structure may easily be damaged, the structure is relative fragile in comparison to the stacked structure solely formed by the solid state gallium nitride. Therefore, in the subsequent lifting-off process (such as FIG. 1H), the light emitting stacking structure 130 may be easily separated from the substrate 100 by an external force applied along a direction (the pushing direction X) perpendicular to the normal line of the breakable structure 120.

Referring to FIG. 1F, after the breakable structure 120 is formed, a first type semiconductor layer 132, an active layer 134 and a second type semiconductor layer 136 are formed on the breakable structure 120 in sequence. Then, a second type electrode 138 such as a P-type electrode is formed on the second type semiconductor layer 136. If the second type semiconductor layer 136 is an N-type semiconductor layer, then the second type electrode 138 is an N-type electrode.

The first type semiconductor layer 132, the active layer 134, the second type semiconductor layer 136 and the second type electrode 138 are stacked to form a light emitting stacking structure 130. To put it in greater details, the first type semiconductor layer 132 may be an N-type semiconductor layer containing electrons carrying negative charges, wherein the N-type semiconductor layer may be doped with impurities such as silicon. The second type semiconductor layer 136 may be a P-type semiconductor layer containing holes carrying positive charges, wherein the P-type semiconductor layer may be doped with impurities such as magnesium. The first type semiconductor layer 132 and the second type semiconductor layer 136 are made of Group III nitride material. The active layer 134 may be a multi-quantum well (MQW) layer. The first type semiconductor layer 132, the active layer 134 and the second type semiconductor layer 136 are sequentially formed by organic chemical vapor deposition method (MOCVD), molecular beam epitaxy method (MBE), liquid phase epitaxy method (LPE) or vapor phase epitaxy method (VPE), and details are not repeated here.

Referring to FIG. 1G, after the second type electrode 138 is formed, a supporting substrate 140 is formed on the second type electrode 138, wherein the supporting substrate 140 is made of metal or a conductive material. In an embodiment, the supporting substrate 140 is electrical conductive, and further has thermal conductive function for quickly dissipating the heat, which is generated in company with the generation of photons by the light emitting stacking structure 130, to the external to avoid the heat being accumulated in the light emitting stacking structure 130 and jeopardizing the luminous efficiency of the active layer 134. Besides, the supporting substrate 140 is formed on the second type electrode 138 by way of electroplating, deposition or lamination. For example, the supporting substrate 140 may be a pre-molded metal film, and then is laminated on the second type electrode 138. Also, the supporting substrate 140 may be formed on the second type electrode 138 by electroplating, chemical vapor deposition or physical vapor deposition. In subsequent procedures, the supporting substrate 140 provides sufficient thickness and strength to support the light emitting stacking structure 130, lest the light emitting stacking structure 130 might be damaged by an external force applied to the substrate 100.

Referring to FIG. 1H, under the circumstance that the light emitting stacking structure 130 is protected by the supporting substrate 140, the breakable structure 120 is damaged so that at least a portion of the breakable structure 121 is separated from the light emitting stacking structure 130. The breakable structure 120 may be damaged in the same manner disclosed above. The breakable structure 120 is heated to a temperature higher than the melting point of the M metal (such as gallium) droplet structure 104, so that the internal M metal of the breakable structure 120 becomes liquid. Then, an external force is applied along a direction (the pushing direction X) substantially perpendicular to the normal line of the breakable structure 120 to separate the light emitting stacking structure 130 from the substrate 100, and the breakable structure 120 is damaged accordingly. The portion of the breakable structure 122 remaining on the first type semiconductor layer 132 may be removed by way of grinding, so that a surface of the first type semiconductor layer 132 of the light emitting stacking structure 130 is exposed.

In another embodiment, the breakable structure 120 is damaged mainly due to the difference in the coefficient of thermal expansion between the substrate 100 (such as sapphire substrate) and the supporting substrate 140 (such as silicon substrate). The breakable structure 120 may be damaged by the thermal stress generated from thermal expansion, and can be easily separated from the substrate 100 without applying any external force.

Referring to FIG. 1I, after the breakable structure 120 is damaged, only the light emitting stacking structure 130 is left on the supporting substrate 140. Meanwhile, a first type electrode 131 may be formed on a surface 132a of the first type semiconductor layer 132, wherein the first type electrode 131 may be an N-type electrode. If the first type semiconductor layer 132 is a P-type semiconductor layer, then the first type electrode 131 is a P-type electrode. Thus, the manufacturing process of the vertical type solid state light emitting device 150 is completed.

According to the manufacturing process of the vertical type solid state light emitting device 150 disclosed in the above embodiments, the breakable structure 120 may be damaged by simple heating equipment instead of high cost grinding equipment or laser lift-off equipment, hence reducing the cost of the manufacturing equipment. Also, when the breakable structure 120 is damaged, the light emitting stacking structure 130 remains intact, hence increasing the reliability and yield of the vertical type solid state light emitting device 150.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing process of a vertical type solid state light emitting device, comprising the following steps:
    providing a substrate;
    growing an M metal nitride buffer layer on the substrate;
    forming a breakable structure on the M metal nitride buffer layer, wherein the breakable structure contains a plurality of M metal droplet structures;
    forming a first type semiconductor layer, an active layer and a second type semiconductor layer on the breakable structure in sequence;
    forming a second type electrode on the second type semiconductor layer, wherein the first type semiconductor layer, the active layer, the second type semiconductor layer and the second type electrode are stacked to form a light emitting stacking structure;
    damaging the breakable structure to separate the substrate from the light emitting stacking structure, so that a surface of the first type semiconductor layer of the light emitting stacking structure is exposed; and
    forming a first type electrode on the surface of the first type semiconductor layer.

2. The manufacturing process of a vertical type solid state light emitting device according to claim 1, wherein the step of forming the breakable structure comprises:
    (1) growing a first M metal nitride layer on the M metal nitride buffer layer;
    (2) infusing a first reaction gas which reacts with the first M metal nitride layer, so that some of M metals are precipitated from the first M metal nitride layer and the plurality of M metal droplet structures are grown on a surface of the first M metal nitride layer;
    (3) infusing a second reaction gas which reacts with the plurality of M metal droplet structures, and forming an M metal nitride on respective surfaces of the M metal droplet structures;
    (4) growing a second M metal nitride layer on the first M metal nitride layer and covering the M metal nitride formed in step (3) to form a breakable layer; and
    (5) repeating steps (2)-(4) to form a plurality of breakable layers.

3. The manufacturing process of a vertical type solid state light emitting device according to claim 2, wherein the first reaction gas reacts with the first M metal nitride layer at 800-1500° C. to precipitate the plurality of M metal droplet structures.

4. The manufacturing process of a vertical type solid state light emitting device according to claim 3, wherein the first reaction gas comprises hydrogen.

5. The manufacturing process of a vertical type solid state light emitting device according to claim 2, wherein the second reaction gas comprises ammonia.

6. The manufacturing process of a vertical type solid state light emitting device according to claim 1, wherein the M metal is made of a material selected from elements of group III of the periodic table.

7. The manufacturing process of a vertical type solid state light emitting device according to claim 6, wherein separating the substrate from the light emitting stacking structure, further comprises:
    removing a portion of the breakable structure remaining on the first type semiconductor layer to expose the surface of the first type semiconductor layer.

8. The manufacturing process of a vertical type solid state light emitting device according to claim 6, wherein after forming the second type electrode, the process further comprises forming a supporting substrate on the second type electrode.

9. The manufacturing process of a vertical type solid state light emitting device according to claim 8, wherein the supporting substrate is made of metal or a conductive material.

10. The manufacturing process of a vertical type solid state light emitting device according to claim 9, wherein the supporting substrate is formed on the second type electrode by way of electroplating, deposition or lamination.

11. The manufacturing process of a vertical type solid state light emitting device according to claim 6, wherein the first type semiconductor layer is an N-type semiconductor layer, the second type semiconductor layer is a P-type semiconductor layer, the first type electrode is an N-type electrode, and the second type electrode is a P-type electrode.

12. The manufacturing process of a vertical type solid state light emitting device according to claim 11, wherein the N-type semiconductor layer and the P-type semiconductor layer comprise a Group III nitride material.

13. The manufacturing process of a vertical type solid state light emitting device according to claim 1, wherein damaging the breakable structure comprises:
    heating the breakable structure; and
    applying an external force along a direction substantially perpendicular to a normal line of the breakable structure to separate the light emitting stacking structure from the substrate.

14. The manufacturing process of a vertical type solid state light emitting device according to claim 13, wherein a temperature in the heating step is higher than the melting point of the plurality of M metal droplet structures.

* * * * *